United States Patent [19]
Loef

[11] Patent Number: 6,014,005
[45] Date of Patent: Jan. 11, 2000

[54] METHOD AND CIRCUIT ARRANGEMENT FOR THE CONTROL OF A MOTOR

[75] Inventor: Christoph Loef, Aachen, Germany

[73] Assignee: U.S. Philips Corporation, New York, N.Y.

[21] Appl. No.: 09/039,349

[22] Filed: Mar. 13, 1998

[30] Foreign Application Priority Data

Mar. 19, 1997 [DE] Germany .................. 197 11 414

[51] Int. Cl.[7] ........................................ H02P 5/34

[52] U.S. Cl. ............................ 318/802; 318/808

[58] Field of Search .................... 318/727–832

[56] References Cited

FOREIGN PATENT DOCUMENTS 2333978  1/1974  Germany .................. H02P 5/40

*Primary Examiner*—David Martin
*Attorney, Agent, or Firm*—F. Brice Faller

[57] ABSTRACT

A circuit arrangement is provided for controlling an electric motor (2), in particular a three-phase, three-strand motor, which is coupled to an intermediate circuit voltage (4) via a DC/AC converter (3) having three DC/AC converter branches (7,8,9). A measuring signal ($i_{b1}, i_{b2}, i_{b3}$) which is proportional to the branch current is derived from each of the DC/AC converter branches (7,8,9), and a control signal ($I_{pn}$), which is substantially proportional to the total value of the strand currents ($i_1, i_2, i_3$) of the motor, is derived from these measuring signals ($i_{b1}, i_{b2}, i_{b3}$).

11 Claims, 1 Drawing Sheet

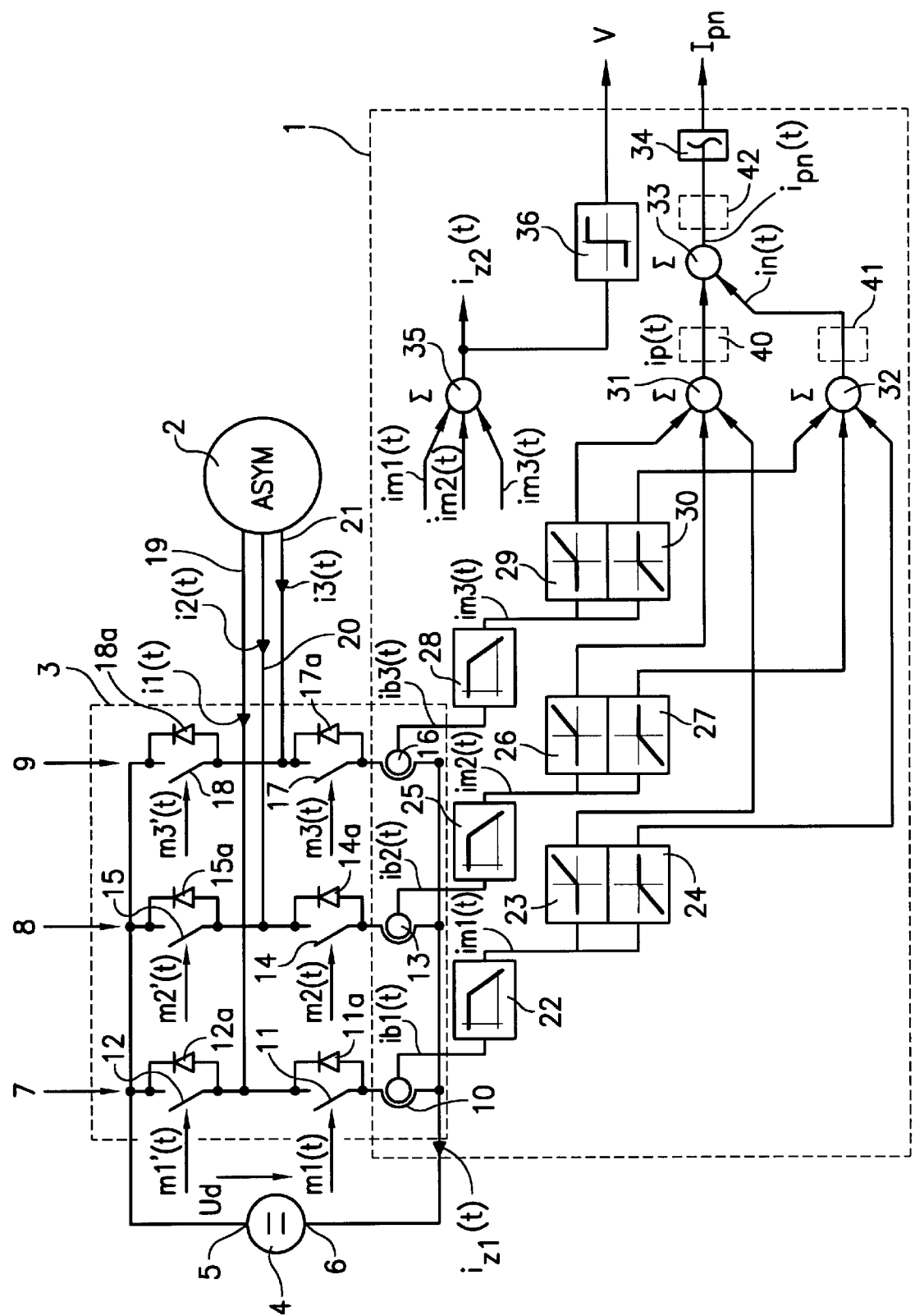

METHOD AND CIRCUIT ARRANGEMENT FOR THE CONTROL OF A MOTOR

BACKGROUND OF THE INVENTION

The invention relates to a method and a circuit arrangement for the control of a motor, in particular a three-phase, three-strand motor which is coupled to an intermediate circuit voltage via a DC/AC converter which comprises DC/AC converter branches.

A method and a circuit arrangement for the control of a three-phase, three-strand motor are known from DE-OS 23 33 978. The three DC/AC converter branches of this known circuit arrangement each comprise two electronic switches with freewheel diodes connected in parallel thereto, while one electronic switch of each DC/AC converter branch is coupled to the positive intermediate circuit potential and the relevant other electronic switch is coupled to the negative intermediate circuit potential. In this known circuit arrangement, the sums of the currents of the electronic switches coupled to the negative intermediate circuit potential and the sums of the currents in the freewheel diodes connected in parallel thereto are measured and evaluated separately.

Such a separate measurement of the switch currents and freewheel diode currents, however, is possible to a limited degree only nowadays because most electronic switches comprise an integrated freewheel diode.

SUMMARY OF THE INVENTION

It is an object of the invention to provide a different method and a different circuit arrangement by means of which a motor of the kind mentioned in the opening paragraph can be controlled in a simple and reliable manner.

As regards a method, this object is achieved in that a measuring signal which is proportional to the branch current is derived from each of the DC/AC converter branches, and in that a control signal which is substantially proportional to the total value of the strand currents of the motor is derived from the measuring signals.

A measuring signal which is proportional to the branch current is derived from each of the DC/AC converter branches, i.e. there is no subdivision into idle current and effective current. Three measuring signals are accordingly derived from the three DC/AC converter branches in a three-phase, three-strand motor, and a control signal which is substantially proportional to the total value of the strand currents of the motor is derived from these three measuring signals.

A control signal which is substantially proportional to the total value of the strand currents of the motor is particularly suitable for the control of a three-phase, three-strand motor. No potential-separating measuring devices are necessary for deriving the measuring signals proportional to the branch current from the DC/AC converter branches. Such a method can accordingly be realized in an inexpensive manner.

An advantageous embodiment of the invention is characterized in that the control signal is formed by means of a superimposition of the measuring signals.

A further advantageous embodiment of the invention is characterized in that the control signal is formed by means of adding together of the values of the measuring signals.

A further advantageous embodiment of the invention is characterized in that the positive and the negative signal components are derived from each of the measuring signals, in that the positive signal components are added into a first summed signal and the negative signal components are added into a second summed signal, and in that a differential signal is formed from the difference between the first and the second summed signal.

Three positive and three negative signal components are thus derived from the three measuring signals in the case of a three-phase, three-strand motor. The three positive signal components are added together so as to form a first summed signal, and the three negative signal components are summed so as to form a second summed signal. Then the difference is formed from the first and the second summed signal.

A further advantageous embodiment of the invention is characterized in that the measuring signals and/or the summed signals and/or the differential signal are low-pass filtered.

The low-pass filtering of the measuring signals and/or the summed signals and/or the differential signal removes high-frequency signal components from the signals. This renders it possible for the measuring signals and/or the summed signals and/or the differential signals to be processed further by means of simpler circuit arrangements.

A further advantageous embodiment of the invention is characterized in that an average value is formed from the differential signal or from the first and the second summed signal over an integer multiple of one third of the frequency cycle of the motor.

The formation of this average value provides a DC control signal which is proportional to the total value of the strand currents of the motor independently of the degree of modulation of the DC/AC converter and independently of the load factor of the motor.

A further advantageous embodiment of the invention is characterized in that a third summed signal is formed from the sum of the measuring signals, and in that it is derived from the sign of this third summed signal whether the motor is in its motor or generating phase.

The operational condition of the motor can thus be unequivocally determined by means of the control signal and the third summed signal.

As regards a circuit arrangement, the object of the invention is achieved in that current-measuring means are provided in each of the DC/AC converter branches for deriving a measuring signal proportional to the current present in the relevant DC/AC converter branch, and in that evaluation means are provided for deriving from the measuring signals a control signal which is proportional to the total value of the strand currents of the motor.

Three current-measuring means are provided for the three DC/AC converter branches in a three-phase, three-strand motor. The measuring signals derived from the DC/AC converter branches by the three current-measuring means are subsequently processed further by the evaluation means, and a control signal proportional to the total value of the strand currents of the motor is made available.

In a preferred embodiment of the invention, superimposition means are provided for superimposing the measuring signals.

In a further advantageous embodiment of the invention, adding means and summation means are provided for adding together the values of the measuring signals.

A further advantageous embodiment of the circuit arrangement is characterized in that means are provided by which the positive and the negative signal components can be derived from each of the measuring signals, in that adding means are provided for adding the positive signal components so as to form a first summed signal and the negative signal components so as to form a second summed signal, in that at least one difference means for forming a differential signal from the first and the second summed signal is provided, and in that at least one integration means is provided capable of determining an average value from the differential signal or from the first and the second summed signal over an integer multiple of one third of a frequency cycle of the motor.

A further advantageous embodiment of the circuit arrangement is characterized in that filter means are provided for low-pass filtering of the measuring signals and/or the summed signals and/or the differential signal.

High-frequency signal components are removed from the measuring signals and/or the summed signals and/or the differential signals by these filter means. This renders it possible to realize the downstream evaluation means, superimposition means, adding means, summation means and/or difference means with a smaller bandwidth.

Particularly advantageous is an immediate low-pass filtering of the measuring signals.

In a preferred embodiment of the invention, the current-measuring means are realized by means of shunt resistors or Hall sensors. No intricate and expensive potential-separating measuring devices are necessary then.

The circuit arrangement according to the invention and the method according the invention are preferably used for the control of an induction motor or a brushless DC motor. Such motors comprising the circuit arrangement according to the invention find particular suitable applications in ventilators and vacuum cleaners.

The relative expense involved in the drive mechanisms is particularly high in vacuum cleaners and ventilators. The simple circuit arrangement according to the invention which can be inexpensively realized is accordingly highly suitable for these purposes.

For a full understanding of the present invention, reference should now be made to the following detailed description of the preferred embodiments of the invention as illustrated in the accompanying drawing.

BRIEF DESCRIPTION OF THE DRAWING

The sole FIGURE is a block diagram of the motor control circuit according to the invention.

DESCRIPTION OF THE PREFERRED EMBODIMENTS

The sole FIGURE of the drawing shows a circuit arrangement 1 for the control of a three-phase, three-strand, asynchronous motor 2 which is coupled to an intermediate circuit voltage source 4 via a DC/AC converter 3. The intermediate circuit voltage source 4 has a positive intermediate circuit voltage pole 5 and a negative intermediate circuit voltage pole 6. The pulsatory DC/AC converter 3 comprises a first DC/AC converter branch 7, a second DC/AC converter branch 8, and a third DC/AC converter branch 9. The first DC/AC converter branch 7, the second DC/AC converter branch 8 and the third DC/AC converter branch 9 are connected in parallel. The first DC/AC converter branch 7 comprises a series arrangement of a first current-measuring means 10, a first electronic switch 11, and a second electronic switch 12. The first current-measuring means 10 is coupled to the negative intermediate circuit voltage pole 6, and the second electronic switch 12 is coupled to the positive intermediate circuit voltage pole 5. A first freewheel diode 11a is connected in parallel to the first electronic switch 11, and a second freewheel diode 12a is connected in parallel to the second electronic switch 12.

The second DC/AC converter branch 8 comprises a series arrangement of a second current-measuring means 13, a third electronic switch 14 and a fourth electronic switch 15. The second current-measuring means 13 is connected to the negative intermediate circuit voltage pole 6, and the fourth electronic switch 15 is coupled to the positive intermediate circuit voltage pole 5. A third freewheel diode 14a is connected in parallel to the third electronic switch 14, and a fourth freewheel diode 15a is connected in parallel to the fourth electronic switch 15.

The third DC/AC converter branch 9 comprises a series arrangement of a third current-measuring means 16, a fifth electronic switch 17, and a sixth electronic switch 18. The third current-measuring means 16 is connected to the negative intermediate circuit voltage pole 6, and the sixth electronic switch 18 is connected to the positive intermediate circuit voltage pole 5. A fifth freewheel diode 17a is connected in parallel to the fifth electronic switch 17, and a sixth freewheel diode 18a is connected in parallel to the sixth electronic switch 18.

The three-phase, three-strand, asynchronous motor 2 comprises a first strand 19, a second strand 20, and a third strand 21.

The first strand 19 is connected to that branch which interconnects the first electronic switch 11 and the second electronic switch 12. The second strand 20 is connected to that branch which interconnects the third electronic switch 14 and the fourth electronic switch 15. The third strand 21 is connected to that branch which interconnects the fifth electronic switch 17 and the sixth electronic switch 18.

A first strand current $i_1(t)$ flows in the first strand 19, a second strand current $i_2(t)$ flows in the second strand 20, and a third strand current $i_3(t)$ flows in the third strand 21. An intermediate circuit current $i_{z1}(t)$ flows in the intermediate circuit comprising the intermediate circuit voltage source 4.

The first electronic switch 11 is switched in accordance with a switching function $m_1(t)$, the second electronic switch 12 in accordance with a switching function $m_2(t)$, and the third electronic switch 14 in accordance with a switching function $m_3(t)$. The fourth switch 15 is switched in accordance with a switching function $m'_1(t)$ which has the inverted value of the first switching function $m_1(t)$, the fifth switch 17 with a switching function $m'_2(t)$ which has the inverted value of the second switching function $m_2(t)$, and the sixth electronic switch 18 is controlled by a switching function $m'_3(t)$ which has the inverted value of the third switching function $m_3(t)$.

The first current-measuring means 10 is coupled to a first low-pass filter 22 whose output is coupled to a parallel circuit of a first positive component formation means 23 and a first negative component formation means 24.

The second current-measuring means 13 is coupled to a second low-pass filter 25 whose output is connected to a parallel circuit of a second positive component formation means 26 and a second negative component formation means 27.

The third current-measuring means 16 is coupled to a third low-pass filter 28 whose output is coupled to a parallel circuit of a third positive component formation means 29 and a third negative component formation means 30.

The outputs of the first, second, and third positive component formation means 23, 26, 29 are coupled to a first adder 31, the outputs of the first, second, and third negative component formation means 24, 27, 30 are coupled to a second adder 32. The outputs of the first adder 31 and of the second adder 32 are connected to a difference formation means 33. The output of the difference formation means 33 is coupled to a first integration means 34.

A third adder 35 is provided which receives the output signals from the first low-pass filter 22, the second low-pass filter 25, and the third low-pass filter 28. The output of the third adder 35 is coupled to a sign determination means 36 which assigns signal components having a positive sign V to a positive reference value and signal components having a negative sign V to a negative reference value.

The determination of the values of the first strand current $i_1(t)$, of the second strand current $i_2(t)$ and of the third strand current $i_3(t)$ by means of the circuit arrangement 1 will now be explained in more detail.

A current signal $i_{b1}(t)$ proportional to the current flowing in the first DC/AC converter branch 7 is supplied as a measuring signal to the first low-pass filter 22 by the first current-measuring means 10. A current signal $i_{b2}(t)$ proportional to the current flowing in the second DC/AC converter branch 8 is supplied as a measuring signal to the second low-pass filter 25 by the second current-measuring means 13. A current signal $i_{b3}(t)$ proportional to the current flowing in the third DC/AC converter branch 9 is supplied as a measuring signal to the third low-pass filter 28 by the third current-measuring means 16. The first low-pass filter 22, the second low-pass filter 25, and the third low-pass filter 28 each have a cut-off frequency which lies below half the switching frequency of the DC/AC converter. A signal $i_{m1}(t)$ is then present at the output of the first low-pass filter 22, a signal $i_{m2}(t)$ at the output of the second low-pass filter 25, and a signal $i_{m3}(t)$ at the output of the third low-pass filter 28. The low-pass filtered signals $i_{m1}(t)$, $i_{m2}(t)$ and $i_{m3}(t)$ correspond to an integration of the current signals $i_{b1}(t)$, $i_{b2}(t)$ and $i_{b3}(t)$ over a switching cycle of the DC/AC converter 3. The positive signal components are derived from the low-pass filtered signals $i_{m1}(t)$, $i_{m2}(t)$ and $i_{m3}(t)$ by the first positive component formation means 23, the second positive component formation means 26 and the third positive component formation means 29, respectively, and are supplied to the first adder 31. The negative signal components are derived from the low-pass filtered signals $i_{m1}(t)$, $i_{m2}(t)$ and $i_{m3}(t)$ by the first negative component formation means 24, the second negative component formation means 27, and the third negative component formation means 30, respectively, and are supplied to the second adder 32. A first summed signal $i_p(t)$ is then available at the output of the first adder 31, and a second summed signal $i_n(t)$ is available at the output of the second adder 32. The difference of the summed signal $i_p(t)$ of the positive signal components and the summed signal $i_n(t)$ of the negative signal components is then formed by the difference formation means 33. A differential signal $i_{pn}(t)$ is then available at the output of the difference formation means 33. An average signal $I_{pn}$ is formed over an integer multiple of one third of a cycle of the motor frequency from this signal $i_{pn}(t)$ as a control signal by means of the first integration means 34. This average value $I_{pn}$ is a quantity proportional to the total value of the strand currents $i_1(t)$, $i_2(t)$ and $i_3(t)$. The average value $I_{pn}$ is independent of the load factor cos φ of the asynchronous motor 2 and of the degree of modulation of the DC/AC converter 3.

The signals $i_{m1}(t)$, $i_{m2}(t)$ and $i_{m3}(t)$ present at the outputs of the first low-pass filter 22, the second low-pass filter 25, and the third low-pass filter 28 are supplied to a third adder 35 in a manner not shown in any detail. The signals $i_{m1}(t)$, $i_{m2}(t)$ and $i_{m3}(t)$ are added together into a summed signal $i_{z2}(t)$ in the third adder 35. This summed signal $i_{z2}(t)$ is proportional to the intermediate circuit current $i_{z1}(t)$. The sign signal V is determined from this signal $i_{z2}(t)$ by the sign determination means 36. It can be derived from the sign V of the quantity $i_{z2}(t)$ whether the asynchronous motor 2 is in its generating or its motor phase. The circuit arrangement 1 accordingly supplies a control signal $I_{pn}$ which is proportional to the total value of the strand currents $i_1(t)$, $i_2(t)$ and $i_3(t)$ of the asynchronous motor 2, which control signal can be used in a controlling or triggering circuit which is not shown in any detail. This control signal $I_{pn}$ is supplemented with the sign signal V which is available at the output of the sign determination means 36. A suitable evaluation of the control signal $I_{pn}$ and the sign signal V renders it possible to draw unequivocal conclusions about the effective stator current and the phase angle of the asynchronous motor 2 for all operational conditions of the asynchronous motor 2.

An essential advantage of the circuit arrangement described is that the measurement of the current signals $i_{b1}(t)$, $i_{b2}(t)$ and $i_{b3}(t)$ takes place in a potential-related manner, said potential relation being achieved with respect to the negative intermediate circuit voltage pole 6. No expensive, potential-separating measuring devices are necessary as a result of this, and the circuit arrangement shown can be realized in a very inexpensive manner. It is accordingly particularly suitable for use in domestic appliances, for example in vacuum cleaners and ventilators.

The first current-measuring means 10, the second current-measuring means 13, and the third current-measuring means 16 can be realized, for example, by means of a shunt or by means of a Hall sensor. The first low-pass filter 22, the second low-pass filter 25, and the third low-pass filter 28 can be realized, for example, by means of RC networks. The positive component formation means 23, 26 and 29 and the negative component formation means 24, 27 and 30 can be realized, for example, by means of operational amplifiers. The first adder 31 and the second adder 32 can be realized, for example, by a simple joining together of the signals $i_{p1}(t)$, $i_{p2}(t)$ and $i_{p3}(t)$; and $i_{n1}(t)$, $i_{n2}(t)$ and $i_{n3}(t)$, respectively. The difference formation means 33 can be realized, for example, by means of an operational amplifier. The first integration means 34 can be realized, for example, by means of a low-pass filter. It is also conceivable, however, for the quantity $i_{pn}(t)$ to be scanned by a microprocessor at discrete intervals, whereupon the average value $I_{pn}$ is formed by means of this microprocessor.

The immediate low-pass filtering of the measuring signals $i_{b1}(t)$, $i_{b2}(t)$ and $i_{b3}(t)$ has the advantage that the further processing of these measuring signals can be carried out with components of small bandwidth.

It is also possible, however, to place the low-pass filters 22, 25 and 28 behind the first adder 31 and the second adder 32, as indicated by the boxes 40 and 41 in dashed lines, or alternatively behind the difference formation means 33 as indicated by the box 42 in dashed lines. Active components of greater bandwidth are necessary then, however, which leads to higher component costs.

There has thus been shown and described a novel method and circuit arrangement for the control of a motor which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

I claim:

1. A method of controlling an electric motor, in particular a three-phase, three-strand motor, which is coupled to an intermediate circuit voltage via a DC/AC converter having a plurality of DC/AC converter branches, said method comprising the steps of (a) deriving a measuring signal ($i_{b1}, i_{b2}, i_{b3}$) which is proportional to the branch current from each of the DC/AC converter branches, and (b) deriving a control signal ($I_{pn}$) which is substantially proportional to the total value of the strand currents ($i_1, i_2, i_3$) of the motor from the measuring signals ($i_{b1}, i_{b2}, i_{b3}$), said step (b) including the steps of:

(1) deriving the positive and the negative signal components from each of the measuring signals ($i_{b1}, i_{b2}, i_{b3}$),
   (2) adding the positive signal components into a first summed signal ($i_p$) and the negative signal components into a second summed signal ($i_n$), and
   (3) forming a differential signal ($i_{pn}$) from the difference between the first summed signal ($i_p$) and the second summed signal ($i_n$).

2. A method as claimed in claim 1, wherein the measuring signals ($i_{b1}, i_{b2}, i_{b3}$) and/or the summed signals ($i_p, i_n$) and/or the differential signal ($i_{pn}$) are low-pass filtered.

3. A method as claimed in claim 1, wherein an average value ($I_{pn}$) is formed from the differential signal ($i_{pn}$) or from the first summed signal ($i_p$) and the second summed signal ($i_n$), averaged over an integer multiple of one third of the frequency cycle of the motor.

4. A method as claimed in claim 1, further comprising the step of forming a third summed signal ($i_{z2}$) from the sum of the measuring signals ($i_{b1}, i_{b2}, i_{b3}$), the sign of this third summed signal ($i_{z2}$) indicating whether the motor is in its motor or generating phase.

5. A circuit arrangement for controlling an electric motor, in particular a three-phase, three-strand motor, which is coupled to an intermediate circuit voltage via a DC/AC converter having a plurality of DC/AC converter branches, said circuit arrangement comprising, in combination:

(a) current-measuring means associated with each of the DC/AC converter branches for deriving a measuring signal ($i_{b1}, i_{b2}, i_{b3}$) which is proportional to the current present in the respective DC/AC converter branch, and
   (b) evaluation means for deriving from the measuring signals ($i_{b1}, i_{b2}, i_{b3}$) a control signal ($I_{pn}$) which is proportional to the total value of the strand currents ($i_1, i_2, i_3$) of the motor, said evaluation means including:
      (1) means for deriving the positive and the negative signal components from each of the measuring signals,
      (2) adding means for adding together the positive signal components to form a first summed signal ($i_p$) and the negative components so as to form a second summed signal ($i_n$),
      (3) at least one difference means for forming a differential signal ($i_{pn}$) from the first summed signal ($i_p$) and the second summed signal ($i_n$) and,
      (4) at least one integration means for determining an average value ($I_{pn}$) from the differential signal ($i_{pn}$) or from the first summed signal ($i_p$) and the second summed signal ($i_n$), averaged over an integer multiple of one third of a frequency cycle of the motor.

6. A circuit arrangement as claimed in claim 5, further comprising filter means for low-pass filtering of the measuring signal ($i_{b1}, i_{b2}, i_{b3}$) and/or the summed signals ($i_p, i_n$) and/or the differential signal ($i_{pn}$).

7. A circuit arrangement as claimed in claim 5, wherein the current-measuring means are realized by shunt resistors or Hall sensors.

8. A circuit arrangement as claimed in claim 5, further comprising an induction motor coupled to the DC/AC converter branches.

9. A circuit arrangement as claimed in claim 5, further comprising a brushless DC motor coupled to the DC/AC converted branches.

10. A circuit arrangement as claimed in claim 5, further comprising a fan motor coupled to the DC/AC converter branches.

11. A circuit arrangement as claimed in claim 5, further comprising a vacuum cleaner motor coupled to the DC/AC converter branches.

* * * * *